(12) United States Patent
Kim

(10) Patent No.: US 7,029,987 B2
(45) Date of Patent: Apr. 18, 2006

(54) METHOD OF MANUFACTURING SEMICONDUCTOR DEVICE HAVING SHALLOW TRENCH ISOLATION (STI)

(75) Inventor: Sung-Hoan Kim, Gyeonggi-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 385 days.

(21) Appl. No.: 10/106,032

(22) Filed: Mar. 27, 2002

(65) Prior Publication Data

US 2002/0160579 A1    Oct. 31, 2002

(30) Foreign Application Priority Data

Apr. 27, 2001  (KR) ............................. 2001-23049

(51) Int. Cl.
*H01L 21/76* (2006.01)
(52) U.S. Cl. ............................. 438/424; 438/427
(58) Field of Classification Search ............ 438/221, 438/424, 427, 435, 700
See application file for complete search history.

(56) References Cited

U.S. PATENT DOCUMENTS

| | | | | |
|---|---|---|---|---|
| 4,916,086 A | * | 4/1990 | Takahashi et al. | 438/424 |
| 5,298,450 A | * | 3/1994 | Verret | 438/207 |
| 5,801,083 A | * | 9/1998 | Yu et al. | 438/424 |
| 5,923,993 A | * | 7/1999 | Sahota | 438/427 |
| 6,020,230 A | * | 2/2000 | Wu | 438/222 |
| 6,110,797 A | * | 8/2000 | Perry et al. | 438/424 |
| 6,150,212 A | * | 11/2000 | Divakaruni et al. | 438/424 |
| 6,207,532 B1 | * | 3/2001 | Lin et al. | 438/424 |
| 6,214,696 B1 | * | 4/2001 | Wu | 438/424 |
| 6,274,457 B1 | * | 8/2001 | Sakai et al. | 438/424 |
| 6,383,861 B1 | * | 5/2002 | Gonzalez et al. | 438/241 |

OTHER PUBLICATIONS

Stanley Wolf Silicon Processing for the VSLI Era vol. 2 Lattice Press 1990 p. 45.*

* cited by examiner

*Primary Examiner*—David S. Blum
(74) *Attorney, Agent, or Firm*—Volentine Francos & Whitt, PLLC

(57) ABSTRACT

A method of manufacturing a semiconductor device having a shallow trench isolation includes steps of forming a mask layer on a semiconductor substrate, forming a shallow trench in a semiconductor substrate using the mask layer, forming at least one step in the semiconductor substrate at the top of the shallow trench, and then forming a liner layer over the entire surface of the semiconductor substrate so as to line the shallow trench and thereby offer protection during subsequent oxidation. When the mask layer is subsequently removed, the at least one step in the semiconductor substrate allows portions of the liner layer extending outside the shallow trench to be removed without creating problematic dents in the structure.

37 Claims, 22 Drawing Sheets

METHOD OF MANUFACTURING SEMICONDUCTOR DEVICE HAVING SHALLOW TRENCH ISOLATION (STI)

BACKGROUND OF THE INVENTION

1. Field of the Invention

The present invention relates to a method of manufacturing a semiconductor device. More particularly, the present invention relates to a method of manufacturing a semiconductor device having a shallow trench isolation (STI).

2. Description of the Related Art

A complete circuit, such as an integrated circuit (IC), is usually composed of thousands of transistors. A shallow trench isolation (STI) serves as an isolation region to prevent a short circuit between two adjacent transistors. Such STI is formed by producing a shallow trench in a semiconductor substrate by anisotropically etching the semiconductor substrate using a silicon nitride layer as a hard mask, and then filling the shallow trench with an insulating layer.

The characteristics of an STI depend on whether the STI has a liner layer. However, a defect, such as a shallow pit, occurs in an STI that does not have a liner layer, due to subsequent oxidation. The defect degrades the electrical characteristics of the resultant device, and cause a leakage current in a junction region, i.e., adversely affects the isolation of the device. In addition, since the shallow trench formed in the substrate is angulated at its top corner, a gate oxide layer grows insufficiently or non-uniformly during a subsequent thermal oxidation process. Hence, the portion of the gate oxide layer formed on the top corner of the shallow trench is very thin. As a result, a breakdown voltage of the gate oxide layer on the active region becomes lower, and a parasitic current occurs in a transistor, thereby degrading the operability of the resultant device.

In an effort to solve these problems, an STI has been provided with a liner layer. FIGS. 1A to 1F illustrate a process of forming such a conventional STI having a liner layer.

Referring to FIG 1A, a semiconductor substrate 10 having a pad oxide layer 11 and a mask layer 12 formed thereon is provided. The semiconductor substrate is made of silicon and has a field region 10-1 and an active region 10-2. The pad oxide layer 11 and the mask layer 12 are patterned to form a shallow trench 13 in the substrate 10.

Referring to FIG 1B, a buffer oxide layer 14 is formed in the shallow trench 13, and then a liner layer 15 is formed to cover the buffer oxide layer 14. The buffer oxide layer 14 is formed by growing a thermal oxide layer on side portions and a bottom portion of the shallow trench 13. The buffer oxide layer 14 is provided to cure damage that has occurred during the process of etching the semiconductor substrate 10 to form the trench 13, and to prevent stress and a trap center from being generated between the liner layer 15 and the silicon substrate 10. The liner layer is generally made of a nitride.

Subsequently, as shown in FIG. 1C, the shallow trench 13 is filled with an insulating layer 18. Thereafter, as shown in FIG 1D, the liner layer 15 and the insulating layer 16 formed on the mask layer 12 are polished by a CMP process so as to planarize a surface of the substrate 10, until a predetermined thickness of the mask layer 12 remains.

Next, as shown in FIG. 1E, the mask layer 12 is removed. Finally, as shown in FIG. 1F, a wet-etching process is performed to remove the pad oxide layer 11. As a result, a shallow trench isolation (STI) 17 is formed to prevent defects that would otherwise occur due to a subsequent oxidation.

However, the conventional method of forming the STI has a problem in that when the mask layer 12 is removed, as shown in FIG. 1E, a portion of the liner layer 15 is also removed, thereby forming dents 18. In addition, as shown in FIG 1F, the dents 18 become deeper due to the wet-etching process performed to remove the pad oxide layer 11.

FIG. 2 is a photograph of an STI made according to the prior art. As can be seen in FIG. 2, very deep dents 28 are formed at the top corner of the shallow trench 23. In FIG. 2, reference numeral 25 denotes the liner layer.

FIG. 3 illustrates a gate oxide layer formed subsequent to the STI. After the STI 17 shown in FIG 1F is formed, a gate oxide layer 20 having a non-uniform thickness is formed on the semiconductor substrate 10. As can be seen in FIG. 3, the gate oxide layer 20 on a region adjacent to an angulated portion (i.e., top corner) of the trench 13 grows insufficiently or non-uniformly. In other words, a portion Tox 32 of the gate oxide layer 20 formed at the edges of active region 10-2 is thinner than a portion Tox 31 of the gate oxide layer 20 formed on the active region 10-2.

FIG. 4 is a photograph of the gate oxide layer illustrated in FIG. 3. FIG. 4 shows that the gate oxide layer on the active region is formed to a thickness of 360 Å, while the gate oxide layer on the edges of the active region is formed to an insufficient thickness of 79 Å.

The gate oxide layer having a non-uniform thickness lowers a breakdown voltage, and so a parasitic current occurs in a transistor, thereby degrading the operability of the resultant device.

SUMMARY OF THE INVENTION

The main object of the present invention is to overcome the problems of the prior art described above.

Thus, one specific object of the present invention is to provide a method of forming a semiconductor device having a shallow trench isolation (STI) which will prevents a gate oxide layer from being grown insufficiently and/or non-uniformly thereon.

It is another object of the present invention to provide a method of forming a semiconductor device having an STI having excellent isolation characteristics.

A method of manufacturing a semiconductor device includes steps of forming a first insulating layer and a mask layer in sequence on a semiconductor substrate having a field region and an active region; using the mask layer to form a shallow trench in the field region of the semiconductor substrate; forming at least one step in the semiconductor substrate to be located in the field region at the top of the substrate adjacent the active region; covering an inner surface of the semiconductor substrate that defines the shallow trench with a second insulating layer; subsequently forming a liner layer over the entire surface of the semiconductor substrate; subsequently forming a third insulating layer that fills the shallow trench; planarizing the resultant structure until a surface of the mask layer is exposed; and performing an etching process to remove the first insulating layer.

The step in the semiconductor susbstrate at the top of the trench may be formed after the shallow trench is formed using the mask layer as a mask. In this case, the mask layer is etched to recess (pull back) the same by a predetermined distance from the top edge of the shallow trench and thereby expose a portion of the first insulating layer. Then, the exposed portion of the first insulating layer and the underlying portion of the semiconductor substrate are etched. This pull-back process may be repeated to form additional steps in the semiconducotr substrate.

Alternatively, the step in the semiconductor susbstrate may be formed before the shallow trench is formed. In this case the exposed field region of the semiconductor substrate is etched using the mask layer. Then, first spacers are provided on side walls of the first step and the shallow trench is formed using the mask layer and the spacers as a mask. Alternatively, the substrate is etched again to form an additional step and second spacers are provided before the shallow trench is formed. In any case, the spacers are removed after the shallow trench is formed.

A gate oxide layer may then be formed on the active region of the semiconductor substrate. The gate oxide layer may be a dual oxide layercomprising a first portion having a thickness of 100 Å to 300 Å on one side of the STI, and a second portion having a thickness of less than 80 Å on the other side of the STI.

The mask layer and the liner layer are each made of a nitride. The first insulating layer is a pad oxide layer and the second insulating layer is a buffer oxide layer. The second insulating layer has a thickness of 100 Å to 300 Å. The second insulating layer is a thermal oxide layer made by a thermal oxidation process or is a CVD oxide layer. The third insulating layer is an HDP oxide or a USG layer.

BRIEF DESCRIPTION OF THE DRAWINGS

These and other objects, features and advantages of the present invention will become more apparent from the following detailed description of the preferred embodiments thereof, made with reference to the accompanying drawings of which.

DETAILED DESCRIPTION OF THE PREFFERED EMBODIMENTS

Figure 1A:
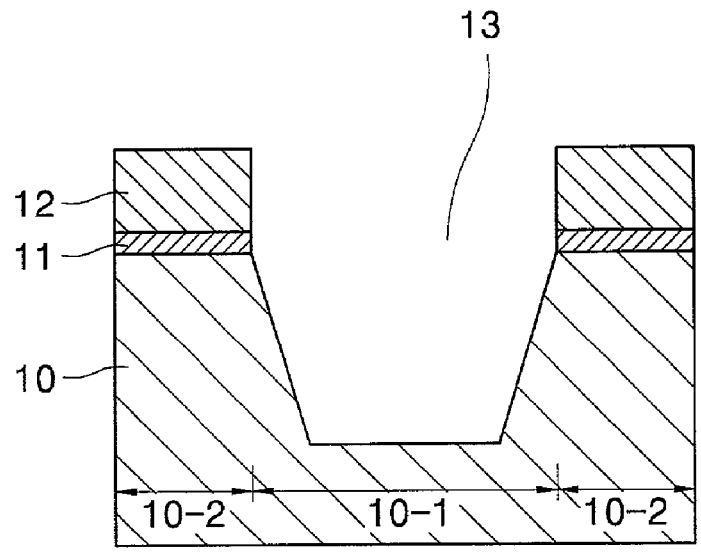
FIGS. 1A to 1F are cross-sectional views of a semiconductor substrate illustrating a process of forming a conventional shallow trench isolation (STI)
Figure 1B:
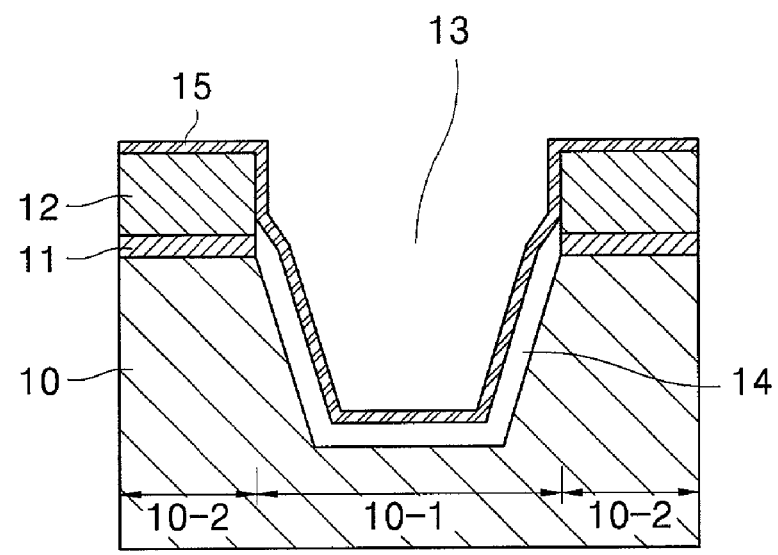
Figure 1C:
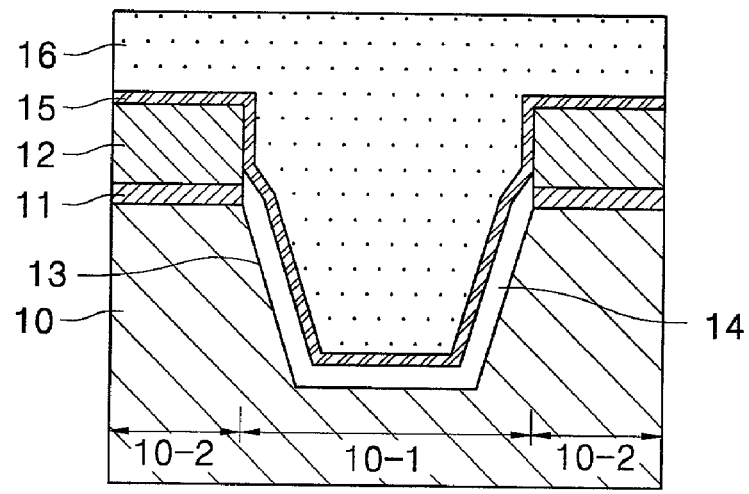
Figure 1D:
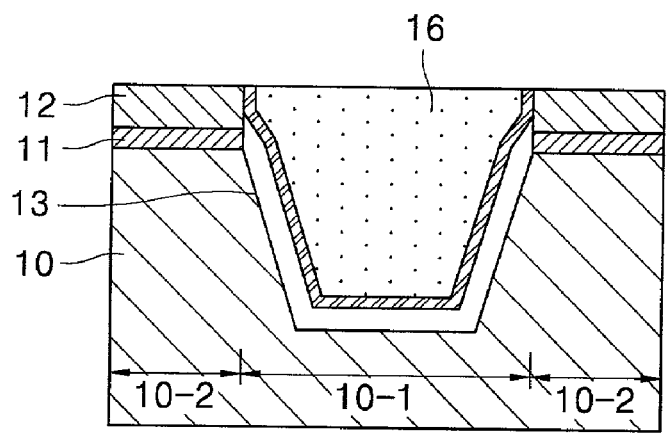
Figure 1E:
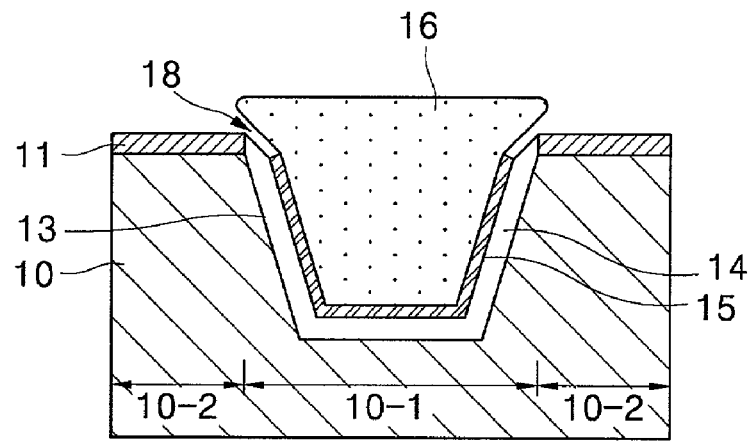
Figure 1F:
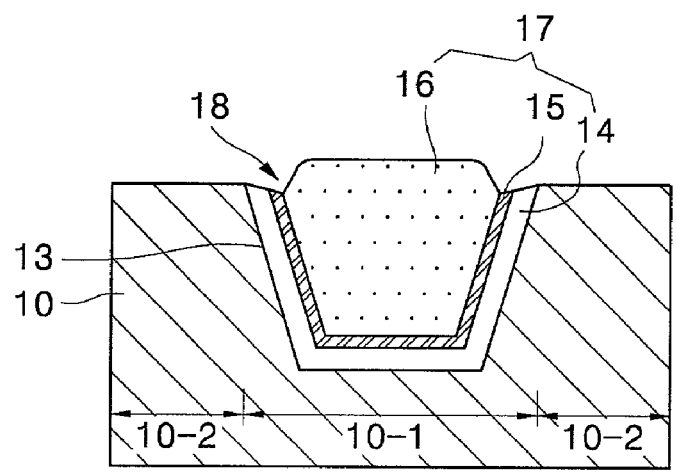
Figure 2:
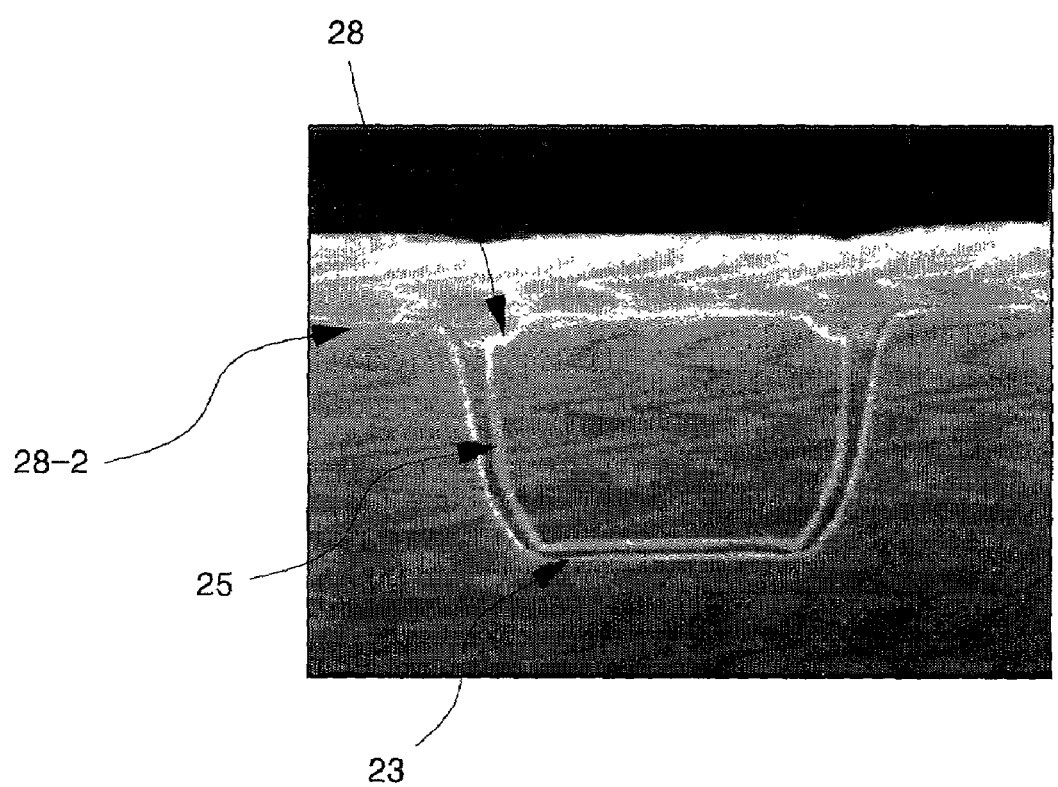
FIG. 2 is an illustration of a photograph illustrating the conventional STI.
Figure 3:
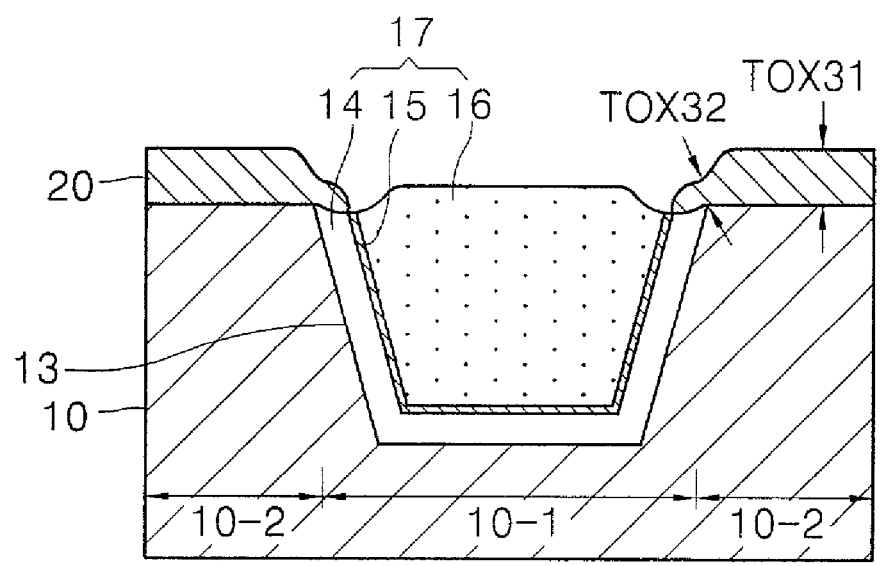
FIG. 3 is a cross-sectional view of a semiconductor substrate illustrating a gate oxide layer formed subsequently to the STI.
Figure 4:
FIG. 4 is an illustration of a photograph of the gate oxide layer of FIG. 3.
Figure 5A:
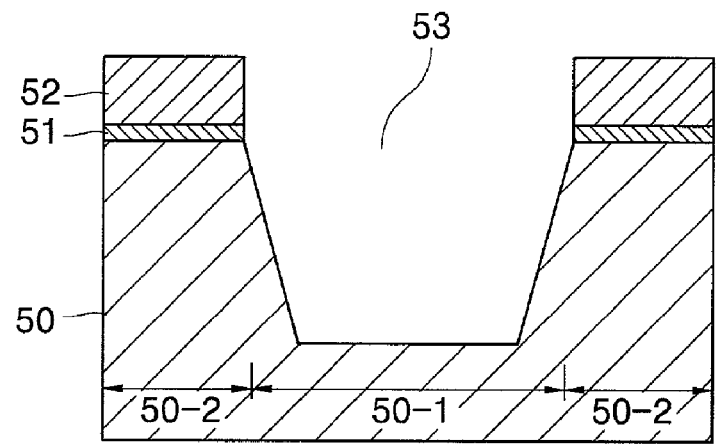
FIGS. 5A to 5G are cross-sectional views of a semiconductor substrate illustrating a first preferred embodiment of a method of forming an STI according to the present invention.

Referring first to FIG. 5A, a semiconductor substrate 50 having a pad oxide layer 51 and a mask layer 52 formed thereon is provided. The semiconductor substrate 50 includes a field region 50-1 and an active region 50-2. The pad oxide layer 51 and the mask layer 52 are patterned, and a shallow trench 53 is formed in the substrate 50.

Figure 5B:
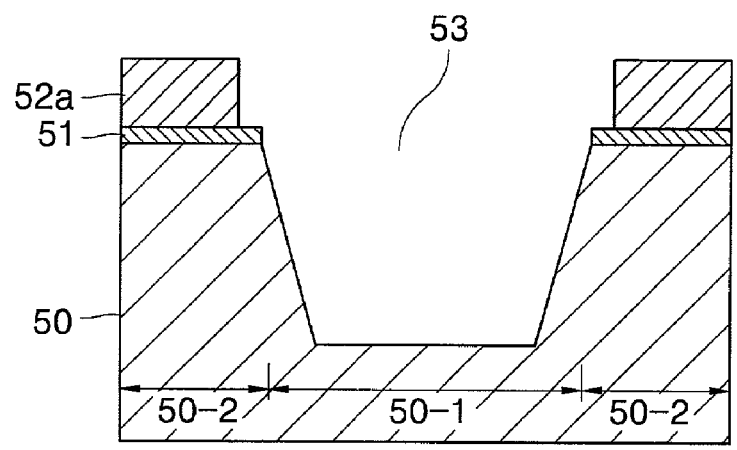

Referring to FIG. 5B, the mask layer 52 is wet-etched using phosphoric acid to form a recess of a predetermined dimension therein from the edge of the trench 53. This process will be referred to as a pull-back process. The amount that the mask layer 52 is to be "pulled-back" depends on the desired size of a step which will be formed next.

Figure 5C:
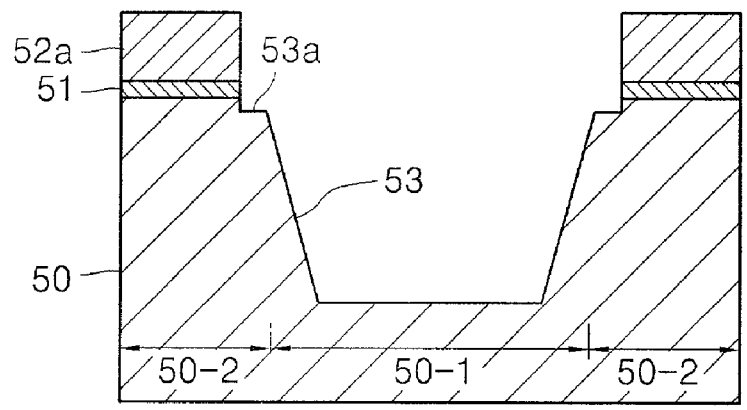

Referring to FIG. 5C, the exposed portion of the pad oxide layer 51 and the semiconductor substrate 50 are etched using the recessed mask layer 52a to form a step 53a at the top of the shallow trench 53. As a result, both edges of the active region 50-2 are formed by the apex of an obtuse angle.

Figure 5D:
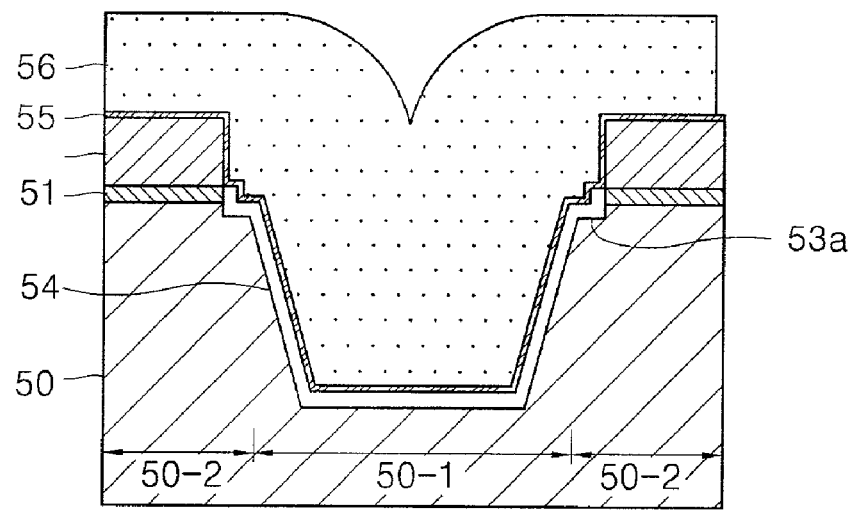

Subsequently, as shown in FIG. 5D, a buffer oxide layer 54 is formed to a thickness of 100 Å to 300 Å by a thermal oxidation process. The buffer oxide layer 54 is made of a CVD oxide which has a relatively low wet-etching rate. Then, a liner layer 55 is formed over the entire surface of the semiconductor substrate 50. The liner layer 55 is made of a nitride. The shallow trench 53 is then filled with an insulating layer 56. The insulating layer 56 is made of a high density plasma oxide (HDP $SiO_2$) or an undoped silicon glass (USG).

Figure 5E:
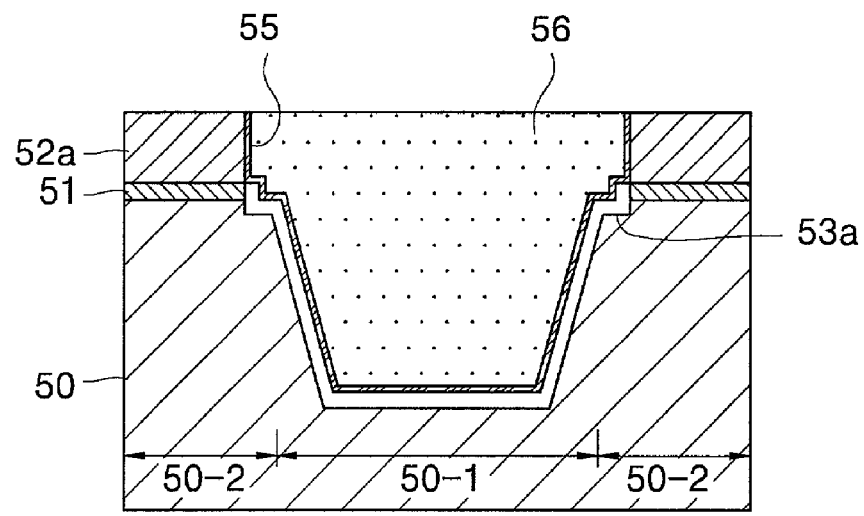

Referring to FIG 5E, the recessed mask layer 52a, the liner layer 55 and the insulating layer 56 are polished by a CMP process to planarize the structure. At this time, the mask layer 52a is exposed.

Figure 5F:
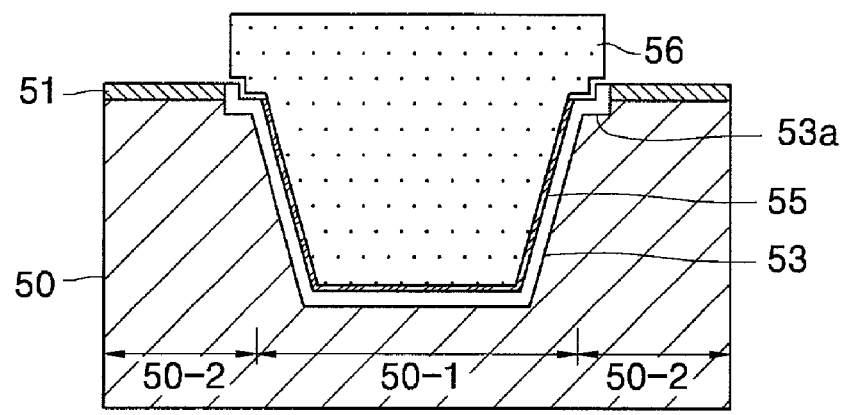
Figure 5G:
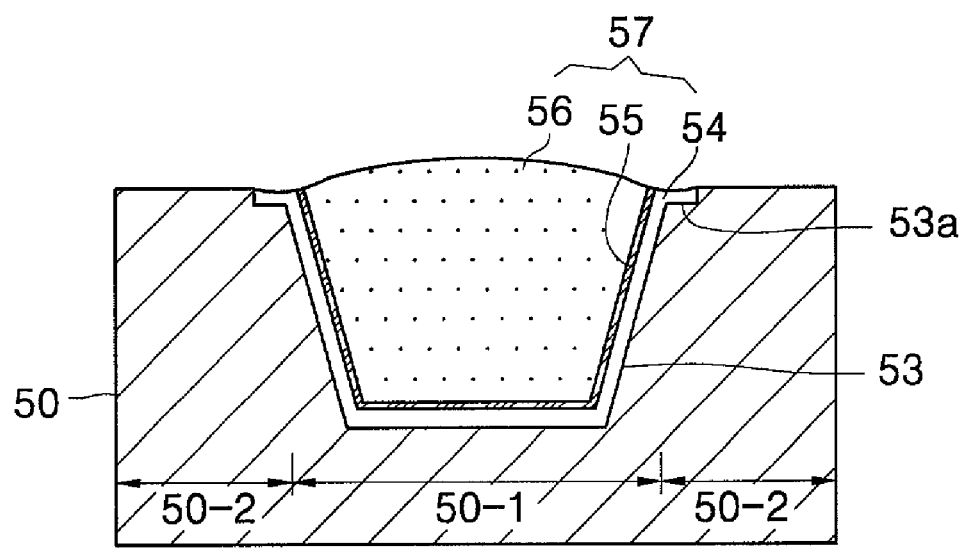

The mask layer 52a is then removed as shown in FIG. 5F. Thereafter, as shown in FIG. 5G, the pad oxide layer 51 is removed by a wet-etching process to form a shallow trench isolation 57 having no dents at the top corners thereof.

Because the STI formed according to the present invention does not have dents, only small amount of leakage current is generated in a junction region. That is, a semiconductor device having an STI manufactured according to the present invention has excellent isolation characteristics. Furthermore, a transistor manufactured using the STI according to the present invention does not possess a hump. Thus, such a transistor will provide a stable operation.

Figure 6:
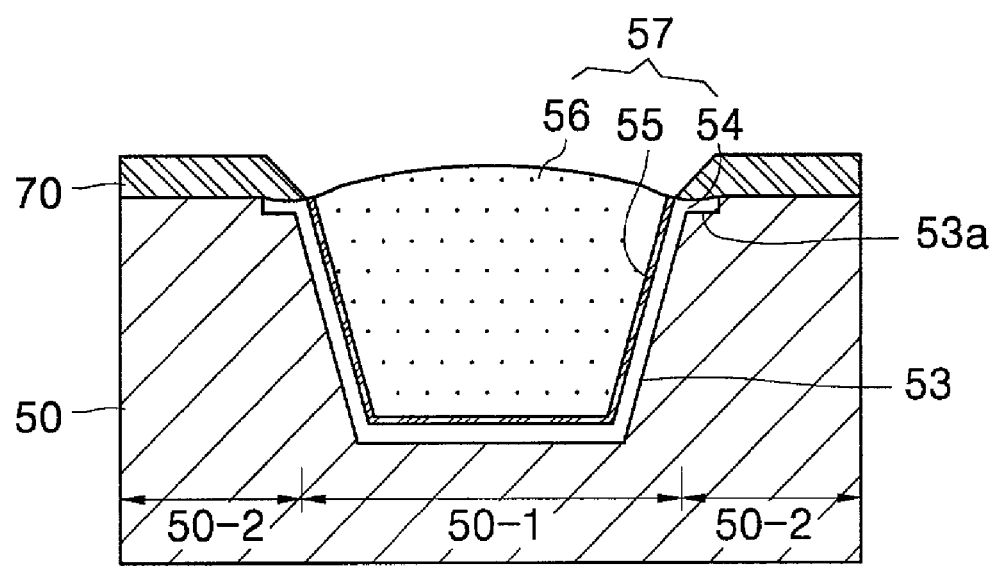
FIG. 6 is a cross-sectional view of the semiconductor substrate illustrating a gate oxide layer formed subsequently to the STI shown in FIG. 5G.

Next, as shown in FIG. 6, a gate oxide layer 70 is formed to a uniform thickness on the semiconductor substrate 50. That is, the gate oxide layer 70 grows sufficiently or uniformly in a region adjacent to the top corner of the shallow trench 53, i.e., on both edges of the active region 50-2, because the STI 57 has no dents. As a result, a breakdown phenomenon is prevented, whereby the resultant device has excellent operating characteristics.

Figure 7:
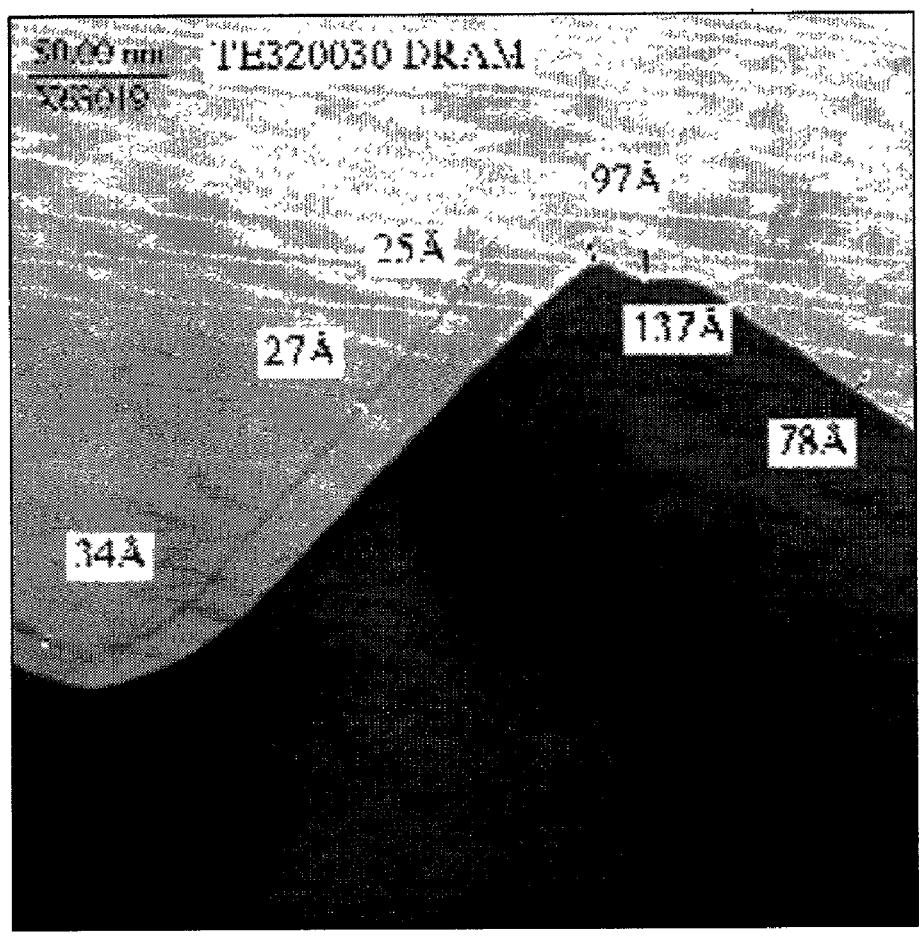
FIG. 7 is an illustration of a photograph of a semiconductor device comprising the gate oxide layer of FIG. 6.

FIG. 7 shows a photograph of a semiconductor device having the gate oxide layer of FIG. 6. As can be seen in FIG. 7, the gate oxide layer is formed to a uniform thickness.

FIGS. 8A to 8D illustrate a method of manufacturing a semiconductor device having a dual gate oxide layer according to the present invention.

Figure 8A:
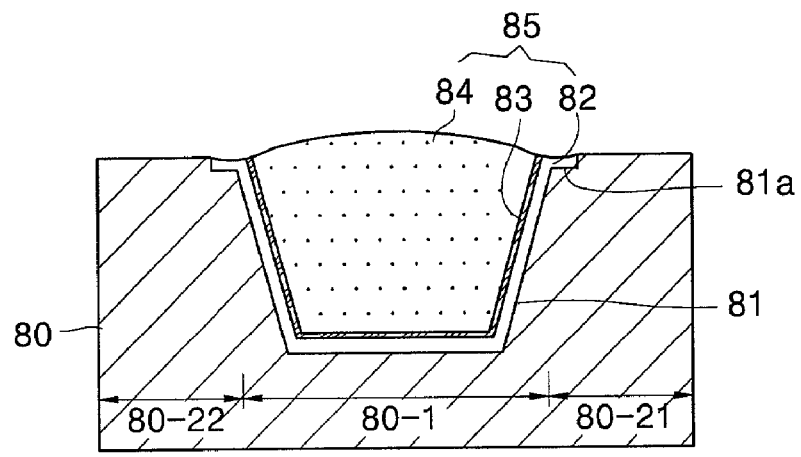
FIGS. 8A to 8D are cross-sectional views of a semiconductor substrate illustrating the first preferred embodiment of the method according to the present invention as applied to the manufacturing a semiconductor device having a dual gate oxide layer.

Referring to FIG. 8A, a semiconductor substrate 81 having a field region 80-1 and first and second active regions 80-21 and 80-22 is provided. A shallow trench 81 is formed in the field region 80-1 of the semiconductor substrate 80. An STI 85 including a buffer oxide layer 82, a liner layer 83 and an insulating layer 84 is formed in the shallow trench 81 by the same method described with respect to FIGS. 5A to 5G. The liner layer is preferably made of a nitride.

Figure 8B:
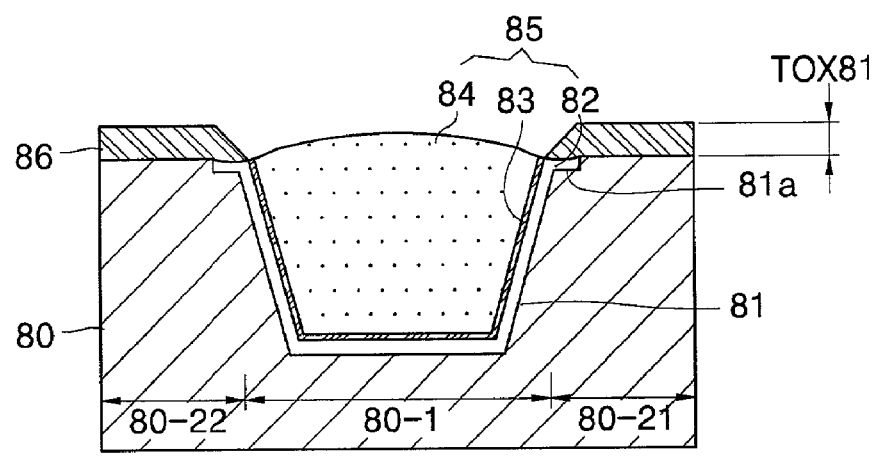

Referring to FIG. 8B, a relatively thick first gate oxide layer 86 is formed on the first active region 80-21 and the second active region 80-22 by a thermal oxidation process. Preferably, a portion Tox 81 of the first gate oxide layer has a thickness in the range of 100 Å to 300 Å.

Figure 8C:
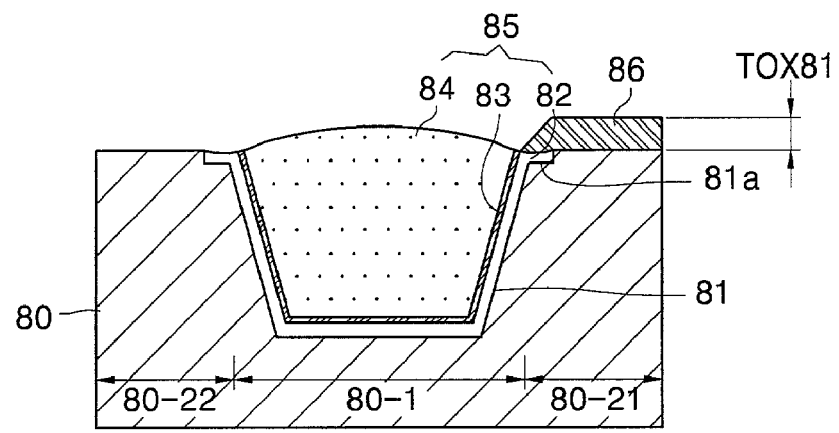

Referring to FIG. 8C, a portion of the first gate oxide layer 86 formed on the second active region 80-22 is removed using a phosphoric acid, whereby the second active region 80-22 is exposed.

Figure 8D:
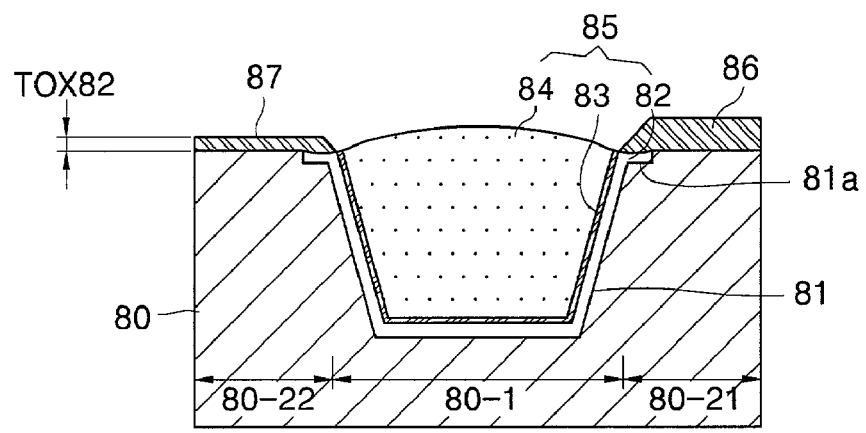

Referring to FIG. 8D, a relatively thin second gate oxide layer 87 is formed on the second active region 80-22. Preferably, the second gate oxide layer 87 has a thickness of less than 80 Å. Accordingly, a dual gate oxide layer is formed.

FIGS. 9A to 9G illustrate a second embodiment of manufacturing an STI according to the present invention.

Figure 9A:
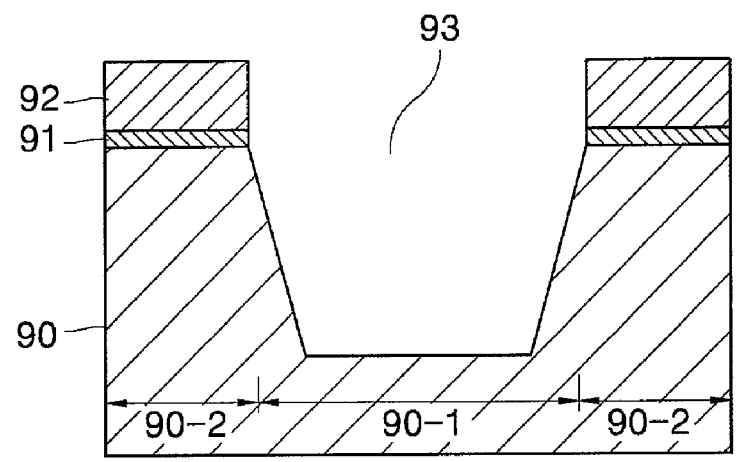
FIGS. 9A to 9G are cross-sectional views of a semiconductor substrate illustrating a second preferred embodiment of a method of manufacturing an STI according to of the present invention.

Referring to FIG. 9A, a semiconductor substrate 90 having a pad oxide layer 91 and a mask layer 92 formed thereon is provided. The semiconductor substrate 90 includes a field region 90-1 and an active region 90-2. The pad oxide layer 91 and the mask layer 92 are patterned, and a shallow trench 93 is formed in the field region 90-1 of the substrate 90.

Figure 9B:
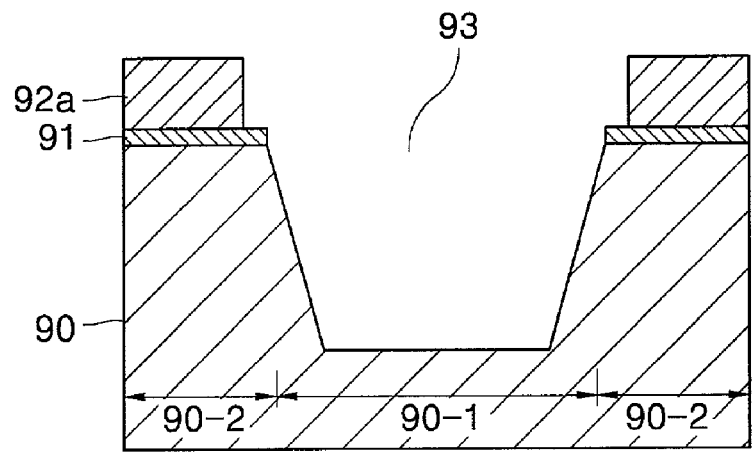

Referring to FIG. 9B, the mask layer 92 is wet-etched using phosphoric acid to form a recess having a predetermined depth from the top corners of the trench 93. That is, a pull-back process is performed on the mask layer 92.

Figure 9C:
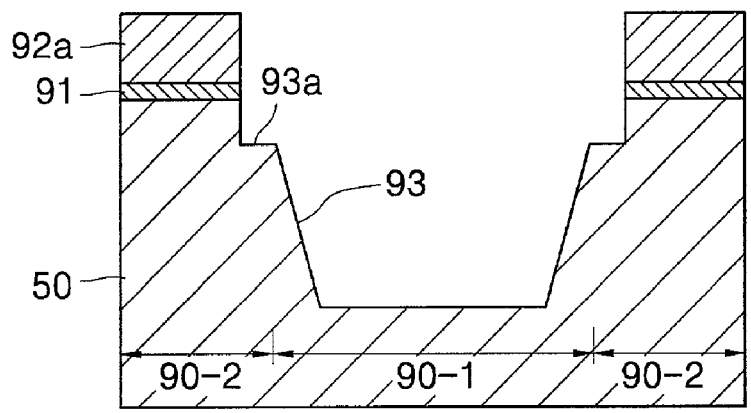

Referring to FIG. 9C, the exposed portion of the pad oxide layer 91 and the semiconductor substrate 90 are etched using the recessed mask layer 92*a* to form a first step 93*a* at the top of the shallow trench 93 9 (at the top of the substrate in the corners thereof.

Figure 9D:
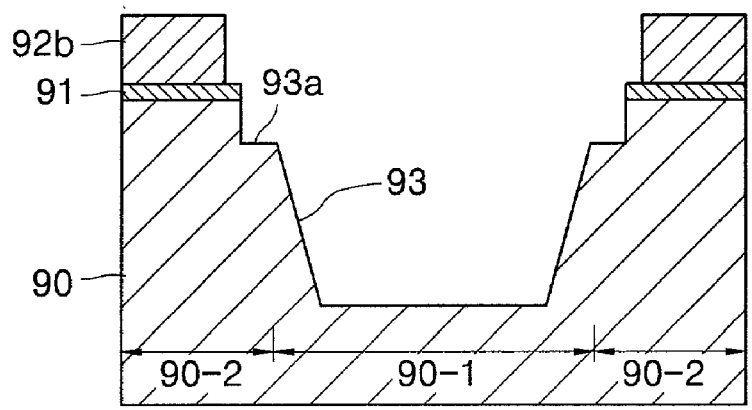

Subsequently, as shown in FIG. 9D, the recessed mask layer 92*a* is wet-etched again so as to be pulled back by a predetermined distance.

Figure 9E:
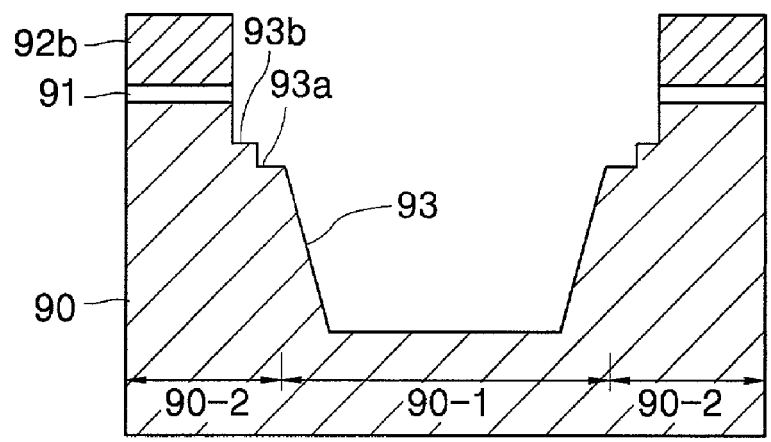

Then, as shown in FIG. 9E, the exposed portion of the pad oxide layer 91 and the semiconductor substrate 90 are etched using the recessed mask layer 92*b* to form a second step 93*b* at the top of the shallow trench 93.

Figure 9F:
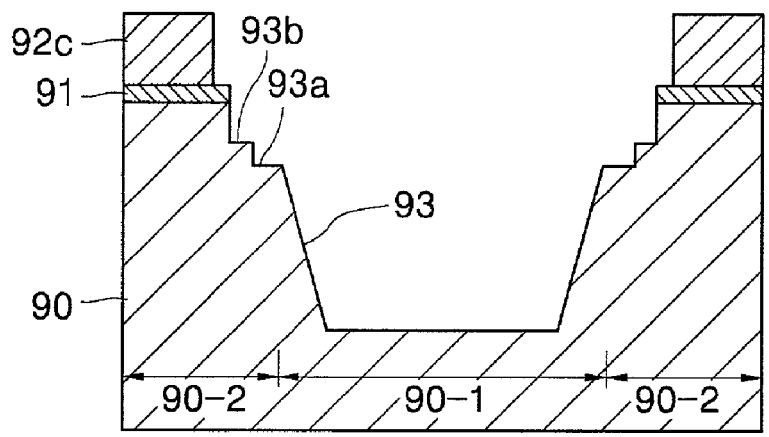
Figure 9G:
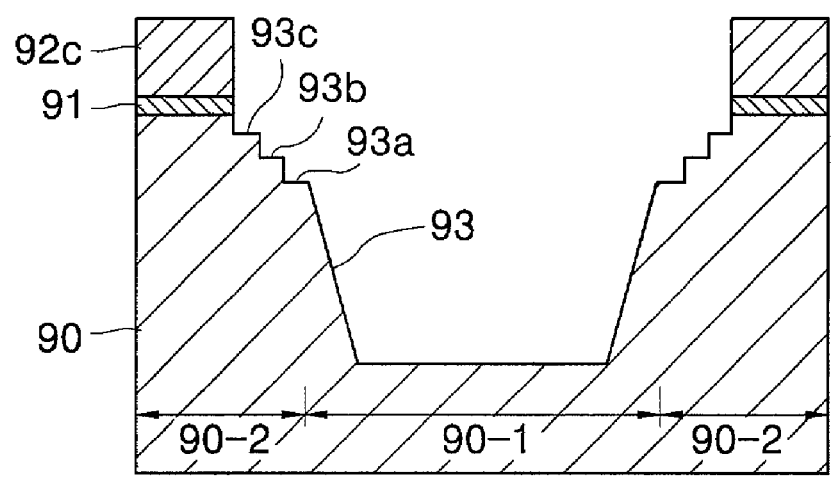

Referring to FIGS. 9F and 9G, a pull-back process as described in connection with FIGS. 9D and 9E is performed to form a third step 93*c*.

At this point, the first step 93*a* is deeper than the second step 93*b* and the third step 93*c*, and the second step 93*b* is deeper than the third step 93*c*. Notes however, although three steps 93*a* to 93*c* are formed in this embodiment of the present invention, the present invention may be used to form any practical number of steps in the substrate.

Subsequently, a shallow trench isolation is formed in the shallow trench 93 by the same method described with respect to FIGS. 5D to 5G Then, a gate oxide layer or a dual gate oxide layer is formed by the same method as described in connection with FIG. 6 or FIGS. 8A to 8D.

FIGS. 10A to 10H illustrate a third embodiment of a method of manufacturing an STI according to the present invention.

Figure 10A:
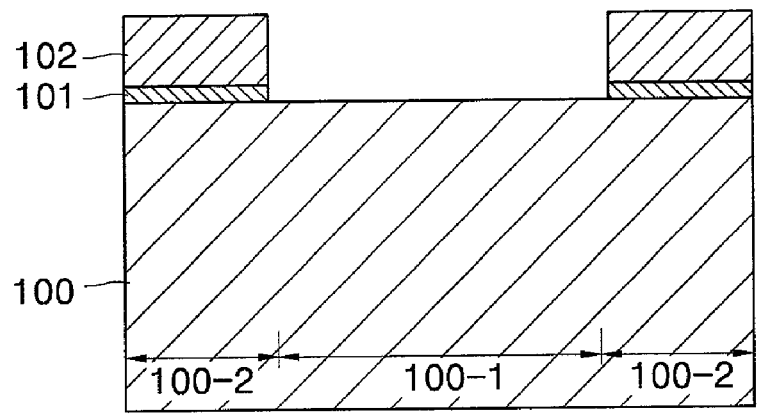
FIGS. 10A to 10H are cross-sectional views of a semiconductor substrate illustrating a third preferred embodiment of a method of manufacturing an STI according to of the present invention.

Referring to FIG. 10A, a semiconductor substrate 100 having a pad oxide layer 101 and a mask layer 102 formed thereon is provided. The semiconductor substrate 100 includes a field region 100-1 and an active region 100-2. The pad oxide layer 101 and the mask layer 102 are patterned to expose the field region 100-1 of the substrate 100.

Figure 10B:
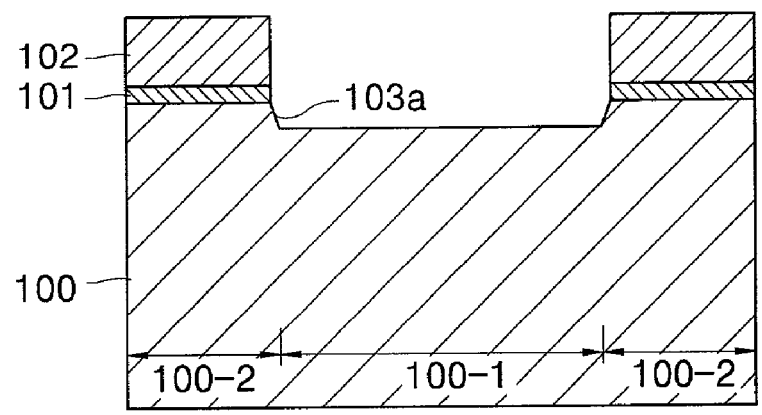

Referring to FIG. 10B, the field region 100-1 of the semiconductor substrate 100 is etched a predetermined amount using the mask layer 102 to form a first step 103*a* in the top of the field region 100-1 of the substrate 100 adjacent the active region 100-2.

Figure 10C:
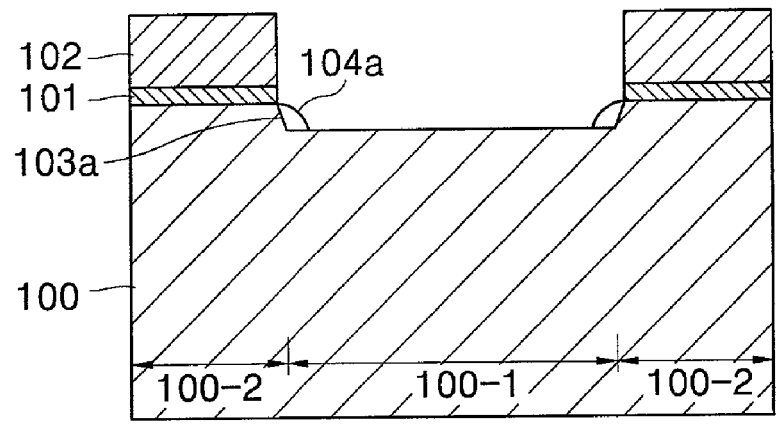

Referring to FIG. 10C, first spacers 104*a* are formed on side walls of the first step 103*a*.

Figure 10D:
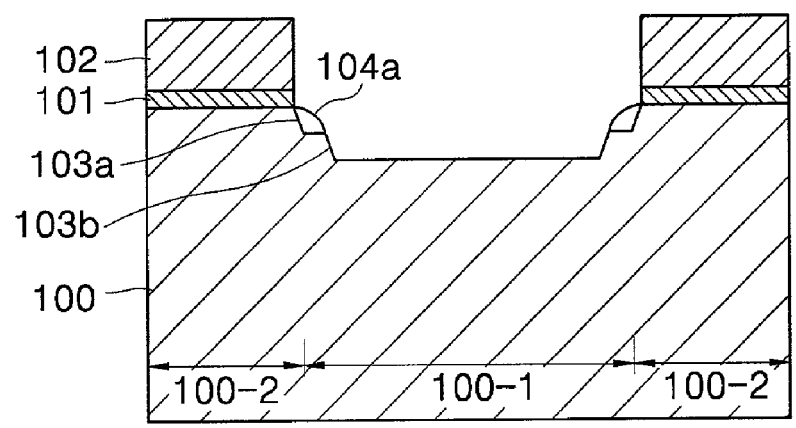

Referring to FIG. 10D, the exposed portion of the semiconductor substrate 100 is etched using the first spacers 104*a* as a mask to form a second step 103*b*.

Figure 10E:
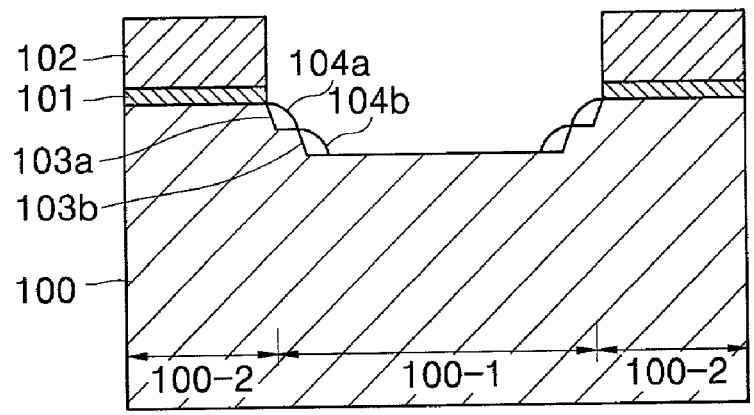

Subsequently, as shown in FIG. 10E, second spacers 104*b* are formed on side walls of the second step 103*b*.

Figure 10F:
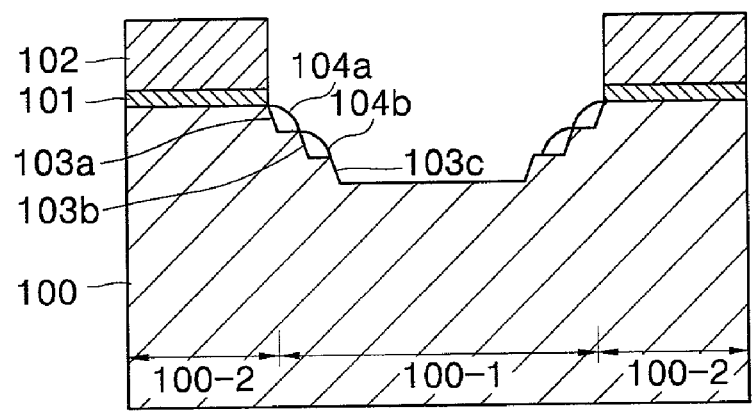

Referring to FIG. 10F, the exposed portion of the semiconductor substrate 100 is etched using the second spacers 104*b* as a mask to form a third step 103*c*.

Figure 10G:
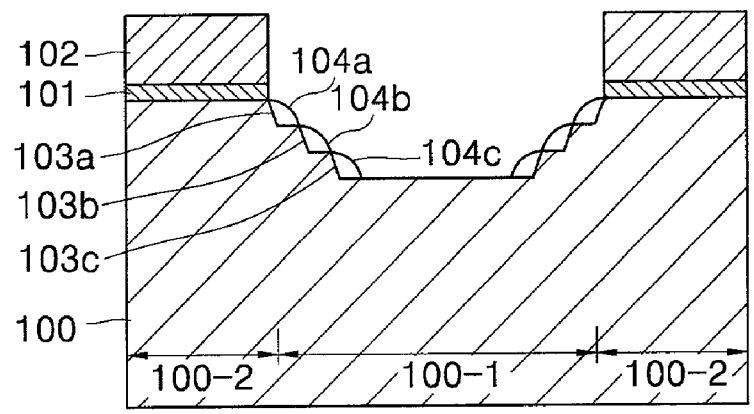
Figure 10H:
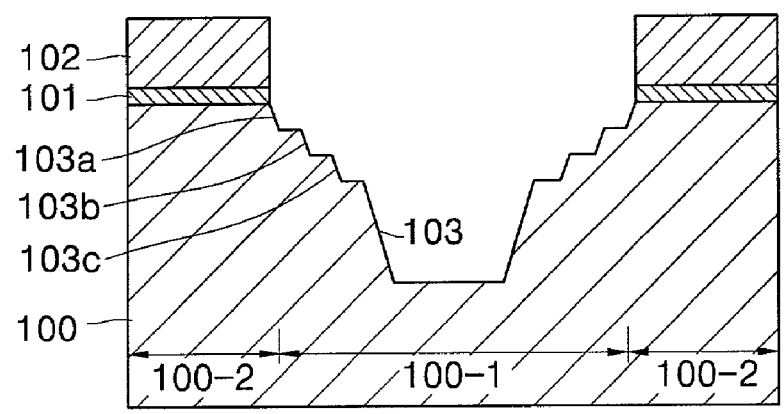

Referring to FIG. 10G, third spacers 104*c* are formed on side walls of the third step 103*c*. Note, the first to third spacers 104*a* to 104*c* are made of a nitride or an oxide Referring to FIG. 10F, the exposed portion of the semiconductor substrate 100 is deeply etched using the third spacers 104*c* as a mask, thereby forming a shallow trench 103.

At this point, the first step 103*a* is shallower than the second step 103*b* and the third step 103*c*, and the second step 103*b* is shallower than the third step 103*c*. Again, even though three steps 103*a* to 103*c* have been described as being formed, the present invention is not limited to the forming of up to only three such steps.

The first to third spacers 104*a* to 104*c* are then removed, although they may be left in place instead. Thereafter, a shallow trench isolation is formed in the shallow trench 103 by the same method described in connection with FIGS. 5D to 5G. Then, a gate oxide layer or a dual gate oxide layer is formed by the same method as described with respect to FIG. 6 or FIGS. 8A to 8D.

As described hereinbefore, the STI formed according to the present invention has no dents, and only a small leakage current is generated in a junction region, whereby a device manufactured according to the present invention exhibits improved isolation characteristics. When a transistor is manufactured using the STI according to the present invention, the transistor has no hump, whereby a stable operation of the transistor is provided.

In addition, the present invention prevents a breakdown phenomenon from occurring because the gate oxide layer or dual gate oxide layer can be formed to a uniform thickness using the STI manufactured according to the present invention. Thus, the resultant device will possess excellent operating characteristics.

Although the present invention has been particularly shown and described with reference to the preferred embodiments thereof, various changes in form and details, as will be apparent to those skilled in the art, may be made to the preferred embodiments without departing from the true spirit and scope of the invention as defined by the appended claims.

What is claimed is:

1. A method of manufacturing a semiconductor device having a shallow trench isolation (STI) structure, comprising:
    a) providing a semiconductor substrate having a field region and an active region;
    b) forming a first insulating layer and mask layer in that sequence on the semiconductor substrate;
    c) patterning the first insulating layer and mask layer, and forming a shallow trench in the semiconductor substrate;
    d) forming at least one step in the semiconductor substrate at the top of the shallow trench;

e) forming a second insulating layer that covers an inner surface of the semiconductor substrate defining the shallow trench;

f) subsequently forming a liner layer over the entire surface of the semiconductor substrate;

g) subsequently forming a third insulating layer over the entire surface of the semiconductor substrate to such a thickness that the third insulating layer fills the shallow trench;

h) polishing the third insulating layer, the liner layer and the mask layer to planarize the same, until a portion of the mask layer is exposed; and i) subsequently performing an etching process to remove the first insulating layer.

2. The method of claim 1, wherein step (d) comprises:

etching the mask layer to recess the etching mask back from the top of the shallow trench, whereby a portion of the first insulating layer adjacent the top of the shallow trench is exposed; and etching the exposed portion of the first insulating layer and a portion of the semiconductor substrate underlying said exposed portion to form a first step in said semiconductor substrate at the top of the shallow trench.

3. The method of claim 2, wherein step (d) further comprises:

etching the recessed mask layer to further recess the etching mask back from the top of the shallow trench, whereby a second portion of the first insulating layer adjacent the top of the shallow trench is exposed; and etching the exposed second portion of the first insulating layer and the underlying semiconductor substrate to form a second step above the first step at the top of the shallow trench.

4. The method of claim 1, wherein step (b) comprises forming the mask layer as a nitride layer and step (f) comprises forming the liner layer as a nitride layer.

5. The method of claim 3, wherein step (b) comprises forming the first insulating layer as a pad oxide layer and step (e) comprises forming the second insulating layer as a buffer oxide layer.

6. The method of claim 5, wherein the buffer oxide layer is formed to a thickness of 100 Å to 300 Å.

7. The method of claim 6, wherein step (e) comprises forming the buffer oxide layer by thermal oxidation.

8. The method of claim 6, wherein step (e) comprises forming the buffer oxide layer by CVD.

9. The method of claim 1, wherein step (g) comprises forming the third insulating layer as one of an HDP oxide layer and a USG layer.

10. The method of claim 1, and further comprising forming a gate oxide layer on the active region of the semiconductor substrate.

11. The method of claim 1, and further comprising:

forming a first gate oxide layer, to a first thickness, on first and second portions of the active region of the semiconductor substrate on opposite sides of the field region, respectively;

removing the first gate oxide layer from the first portion of the active region; and forming a second gate oxide layer on the first portion of the active region of the semiconductor substrate to a second thickness that is less than said first thickness.

12. The method of claim 11, wherein the first gate oxide layer is formed to a thickness of 100 Å to 300 Å.

13. The method of claim 11, wherein the second gate oxide layer is formed to a thickness of less than 80 Å.

14. A method of manufacturing a semiconductor device having a shallow trench isolation (STI) structure, comprising:

a) providing a semiconductor substrate having a field region and an active region;

b) forming a first insulating layer and a mask layer in that sequence on the semiconductor substrate, and patterning the first insulating layer and the mask layer to expose the field region of the semiconductor substrate;

c) forming at least one step in the semiconductor substrate in the exposed field region at a location adjacent edges of the active region of the semiconductor substrate;

d) subsequently forming a shallow trench in the field region of the semiconductor substrate while maintaining the at least one step at the top of the shallow trench;

e) forming a second insulating layer that covers an inner surface of the semiconductor substrate defining the shallow trench;

f) subsequently forming a liner layer over the entire surface of the semiconductor substrate;

g) subsequently forming a third insulating layer over the entire surface of the semiconductor substrate to such a thickness that the third insulating layer fills the shallow trench;

h) polishing the third insulating layer, the liner layer and the mask layer to planarize the same, until a portion of the mask layer is exposed; and i) subsequently performing an etching process to remove the first insulating layer.

15. The method of claim 14, wherein step (c) comprises:

etching the exposed field region of the semiconductor substrate using the mask layer to form a first step in the semiconductor substrate; and forming first spacers on side walls of the first step.

16. The method of claim 15, wherein step (c) further comprises:

etching the exposed field region of the semiconductor substrate using the spacers as a mask to form a second step beneath the first step; and forming second spacers on side walls of the second step.

17. The method of claim 16, wherein step of (c) further comprises:

removing the first and second spacers after forming the shallow trench.

18. The method of claim 14, wherein step (b) comprises forming the mask layer as a nitride layer and step (f) comprises forming the liner layer as a nitride layer.

19. The method of claim 17, wherein step (b) comprises forming the first insulating layer as a pad oxide layer and step (e) comprises forming the second insulating layer as a buffer oxide layer.

20. The method of claim 19, wherein the buffer oxide layer is formed to a thickness of 100 Å to 300 Å.

21. The method of claim 20, wherein step (e) comprises forming the buffer oxide layer by thermal oxidation.

22. The method of claim 20, wherein step (e) comprises forming the buffer oxide layer by CVD.

23. The method of claim 14, wherein step (g) comprises forming the third insulating layer as one of an HDP oxide layer and a USG layer.

24. The method of claim 14, and further comprising forming a gate oxide layer on the active region of the semiconductor substrate.

25. The method of claim 14, and further comprising:
forming a first gate oxide layer, to a first thickness, on first and second portions of the active region of the semiconductor substrate on opposite sides of the field region;
removing the first gate oxide layer from the first portion of the active region; and
forming a second gate oxide layer on the first portion of the active region of the semiconductor substrate to a second thickness that is less than said first thickness.

26. The method of claim 25, wherein the first gate oxide layer is formed to a thickness of 100 Å to 300 Å.

27. The method of claim 25, wherein the second gate oxide layer is formed to a thickness of less than 80 Å.

28. The method of claim 24, wherein step (c) comprises:
etching the exposed field region of the semiconductor substrate using the mask layer to form a first step in the semiconductor substrate; and
forming first spacers on side walls of the first step.

29. The method of claim 28, wherein step (c) further comprises:
etching the exposed field region of the semiconductor substrate using the spacers as a mask to form a second step beneath the first step; and
forming second spacers on side walls of the second step.

30. The method of claim 29, wherein step of (c) further comprises:
removing the first and second spacers after forming the shallow trench.

31. The method of claim 24, wherein step (b) comprises forming the mask layer as a nitride layer and step (f) comprises forming the liner layer as a nitride layer.

32. A method of manufacturing a semiconductor device having a shallow trench isolation (STI) structure, comprising:
a) providing a semiconductor substrate having a field region and an active region located on both sides of the field region;
b) forming a first insulating layer and mask layer in that sequence on the semiconductor substrate;
c) forming a shallow trench in the field region semiconductor substrate using the mask layer as a mask;
d) forming at least one step at the top of the semiconductor substrate in the field region thereof adjacent the active region;
e) forming a second insulating layer that covers an inner surface of the semiconductor substrate that defines the shallow trench;
f) subsequently forming a liner layer over the entire surface of the semiconductor substrate so that the liner layer forms a liner over the shallow trench, the at least one step and the mask layer;
g) subsequently forming a third insulating layer over the entire surface of the semiconductor substrate to such a thickness that the third insulating layer fills the shallow trench;
h) polishing the third insulating layer, the liner layer and the mask layer to planarize the same, until a portion of the mask layer is exposed; and
i) subsequently performing an etching process to remove the first insulating layer.

33. The method of claim 32, and further comprising forming a gate oxide layer on the active region of the semiconductor substrate after the etching process is performed.

34. The method of claim 32, wherein the shallow trench is formed before the at least one step is formed in the semiconductor substrate.

35. The method of claim 34, and further comprising forming a gate oxide layer on the active region of the semiconductor substrate after the etching process is performed.

36. The method of claim 32, wherein the at least one step is formed in the semiconductor substrate before the shallow trench is formed.

37. The method of claim 36, and further comprising forming a gate oxide layer on the active region of the semiconductor substrate after the etching process is performed.

* * * * *